(12) United States Patent
Chen

(10) Patent No.: US 6,235,581 B1
(45) Date of Patent: May 22, 2001

(54) FLOATING GATE MEMORY STRUCTURE AND METHOD FOR FORMING A LOW RESISTANCE CONTINUOUS SOURCE LINE

(75) Inventor: Men-Chee Chen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/108,750

(22) Filed: Jul. 1, 1998

(51) Int. Cl.[7] .................................................. H01L 21/336
(52) U.S. Cl. ................................................................ 438/257
(58) Field of Search ..................................... 438/257, 259, 438/268, 270, 272, 428, 434, 436, 438, 558, 561

(56) References Cited

U.S. PATENT DOCUMENTS 5,696,010 * 12/1997 Malhi ............................ 437/40 DM
5,972,741 * 10/1999 Kubo et al. ....................... 438/138

* cited by examiner

*Primary Examiner*—David Nelms
*Assistant Examiner*—Quoc Hoang
(74) *Attorney, Agent, or Firm*—Jacqueline J. Garner; Wade James Brady, III; Frederick J. Telecky, Jr.

(57) ABSTRACT

The invention comprises a floating gate memory structure, a method for making a floating gate memory structure, and a method for forming a continuous source line in a floating gate memory structure. One aspect of the invention is a method for forming a continuous source line. A plurality of trenches and moats are formed in a semiconductor structure wherein the moats are adjacent to the trenches. A portion of each moat forms the source region of a transistor. A silicate glass layer is deposited outwardly from a semiconductor structure to form an intermediate structure. The silicate glass layer contains an n-type dopant. The intermediate structure is heated for a first period of time to dope the plurality of trenches. Portions of the doped plurality of trenches form a part of at least one continuous source line.

16 Claims, 2 Drawing Sheets

FLOATING GATE MEMORY STRUCTURE AND METHOD FOR FORMING A LOW RESISTANCE CONTINUOUS SOURCE LINE

TECHNICAL FIELD OF THE INVENTION

This invention relates generally to floating gate memory structures in integrated circuits, and more particularly, to a floating gate memory structure and method for forming a low resistance continuous source line.

BACKGROUND OF THE INVENTION

Modern nonvolatile memories include EEPROM devices, such as flash memories that employ a floating gate structure. Memory cells within these devices use channel-hot electrons for programming from the drain side and use Fowler-Nordheim tunneling for erasure from the source side. The gate structure for these devices is typically a stack configuration comprising a floating gate and a control gate separated by an insulation layer.

An existing process used to isolate adjacent conventional flash memory cells is the LOCOS isolation process. Flash memories with LOCOS isolation employ a self-aligned source etch (SAS) and ion implantation to form a continuous source line. The continuous source line normally connects the source of each flash memory cell in a column of the memory and is used for erasing the cells of the memory. To form a continuous source line, a conductive path is created between the source region of adjacent cells so as to create an electrical connection between the adjacent source regions. Preferably, the electrical path through the isolation region is a low resistance path.

More recently, another isolation process has been used to create the isolation region between flash memory cells, especially for embedded memory applications. This process is known as shallow trench isolation (STI), so named because the process results in narrow rectangular trenches between adjacent memory cells. Because of the steepness of the trench walls created by the shallow trench isolation process, it is difficult to use ion implantation in the isolation region, yet maintain a self-aligned source region with a low sheet resistance. The effectiveness of the ion implantation process depends upon the sidewall slope and depth of the trench and control of that process will be difficult to achieve.

To overcome the difficulties of using ion implantation to dope the sidewalls of trench isolation regions, tilt angle ion implantation has been attempted. Unfortunately, tilt angle ion implantation may require the use of multiple energy levels, making the resulting process difficult to control. Also, several tilt angles may need to be used to properly dope the sidewalls of the trench isolation region. The semiconductor processing equipment used for ion implantation must be adjusted for each tilt angle employed in the process. Such adjustment can be time consuming and may require processing to be stopped temporarily for such adjustment to take place. Tilt angle ion implantation may thus substantially increase the cost of flash memory structures in integrated circuits employing shallow trench isolation.

Accordingly, a need has arisen for a processing method which provides for the doping of a trench isolation region so as to form a low resistance continuous source line in a floating gate memory structure.

SUMMARY OF THE INVENTION

The invention employs a silicate glass layer containing an N-type dopant to dope trench sidewalls in a floating gate memory structure. One aspect of the invention is a method for forming a continuous source line. A plurality of trenches and a plurality of moats are formed in a semiconductor structure wherein the plurality of moats are adjacent to the plurality of trenches and a portion of each of the plurality of moats forms the source region of a transistor. A silicate glass layer containing an N-type dopant is deposited outwardly from the semiconductor structure to form an intermediate structure. The intermediate structure is heated for a period of time to dope the plurality of trenches wherein portions of the doped plurality of trenches form a part of at least one continuous source line.

The invention has several important technical advantages. The invention allows greater control over the doping of the continuous source line in a floating gate memory structure, leading to more efficient devices. The invention saves time during the manufacturing process and simplifies that process, thus lowering the cost of manufacturing a floating gate memory device employing a shallow trench isolation process.

BRIEF DESCRIPTION OF THE DRAWINGS

For a more complete understanding of the present invention and the advantages thereof, reference is now made to the following descriptions, taken in connection with the accompanying drawings, in which.

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1:
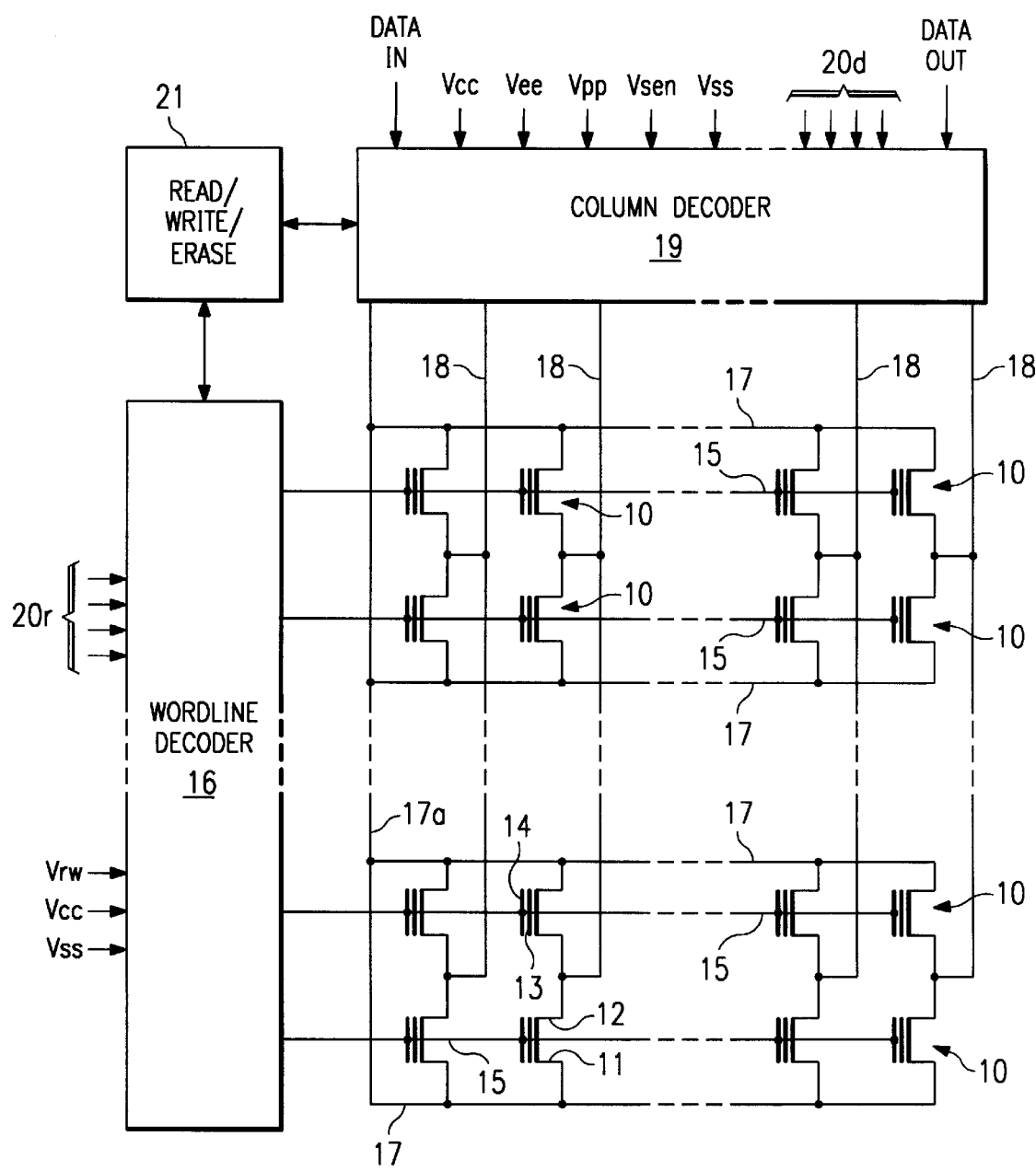
FIG. 1 illustrates an electrical schematic diagram, in partial block form, of a memory cell array.

Referring now to FIG. 1, an example of memory cells, which are an integral part of a memory chip or memory structure in an application specific integrated circuit, are shown for the purpose of illustrating the use of this invention. Each cell comprises a floating gate transistor 10 having a source 11, a drain 12, a floating gate 13 and a control gate 14.

Each of the control gates 14 in a row of cells 10 is connected to a word line 15, and each of the word lines 15 is connected to a word line decoder 16. Each of the sources 11 in a row of cells 10 is connected to a source line 17. Source line 17 may also be referred to as a continuous source line. Each of the drains 12 in a column of cells 10 is connected to a drain-column line 18. Each of the source lines 17 is connected by a column line 17a to a column decoder 19 and each of the drain-column lines 18 is connected to the column decoder 19.

In a write or program mode, the word line decoder 16 may function, in response to word line address signals on lines 20r and to signals from Read/Write/Erase control circuit 21 (or microprocessor 21), to place a preselected first programming voltage Vrw (approximately +12 volts) on a selected word line 15, including a selected control-gate conductor 14. Column decoder 19 also functions to place a second programming voltage Vpp (approximately +5 volts to +10 volts) on a selected drain-column line 18 and, therefore, the drain 12 of a selected cell 10. Source lines 17 are connected to reference potential Vss. All of the deselected drain-column lines 18 are connected to a reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10.

The programming time is selected to be sufficiently long to program the floating gate 13 with a negative program charge of approximately −2 volts to −6 volts with respect to the channel region. For memory cells 10 fabricated in accordance with the preferred embodiment, the coupling coefficient between a control gate 14/word line 15 and a floating gate 13 is approximately 0.5. Therefore, a programming voltage Vrw of 12 volts, for example, on a selected word line 15, including the selected gate control 14, places a voltage of approximately +5 to +6 volts on the selected floating gate 13. The floating gate 13 of the selected cell 10 is charged with channel-hot electrons during programming, and the electrons in turn render the source/drain path under the floating gate 13 of the selected cell 10 nonconductive, a state which is read as a "0" bit. Deselected cells 10 have source-drain paths under the floating gate 13 that remain conductive, and those cells 10 are read as "1" bits.

In a flash erase mode, the column decoder 19 may function to leave all drain-column lines 18 floating. The word line decoder 16 functions to connect all the word lines 15 to reference potential Vss. The column decoder 19 also functions to apply a high positive voltage Vee (approximately +10 volts to +15 volts) to all the source lines 17. These erasing voltages create sufficient field strength across the tunneling area between gate 13 and the substrate to generate a Fowler-Nordheim tunnel current that transfers charge from the floating gate 13, erasing the memory cell 10.

In the read mode, the word line decoder 16 functions in response to word line address signals on line 20r and to signals from Read/Write/Erase control circuit 21, to apply a preselected positive voltage Vcc (approximately +5 volts) to the selected word line 15, and to apply a low voltage (ground or Vss) to deselected word lines 15. The column decoder 19 functions to apply a preselected positive voltage Vsen (approximately +1 volt) to at least the selected drain column line 18 and to apply a low voltage (0 volts) to the source line 17. The column decoder 19 also functions, in response to a signal on address lines 20d, to connect the selected drain-column line 18 of the selected cell 10 to the DATA OUT terminal. The conductive or non-conductive state of the cell 10 connected to the selected drain-column line 18 and the selected word line 15 is detected by a sense amplifier (not shown) connected to the DATA OUT terminal. The read voltages applied to the memory array are sufficient to determine channel impedance for a selected cell 10 but are insufficient to create either hot-carrier injection or Fowler-Nordheim tunneling that would disturb the charge condition of any floating gate 13.

For convenience, a table of Read, Write and Erase voltages is given in Table 1 below:

TABLE 1

|  | READ | WRITE | FLASH ERASE |
| --- | --- | --- | --- |
| Selected Word Line | 5 V | 12 V | 0 V (All) |
| Deselected Word Lines | 0 V | 0 V | — |
| Selected Drain Line | 1 V | 5–10 V | Float (All) |
| Deselected Drain Lines | Float | 0 V | — |
| Source Lines | 0 V | Approx. 0 V | 10–15 V (All) |

Figure 2:
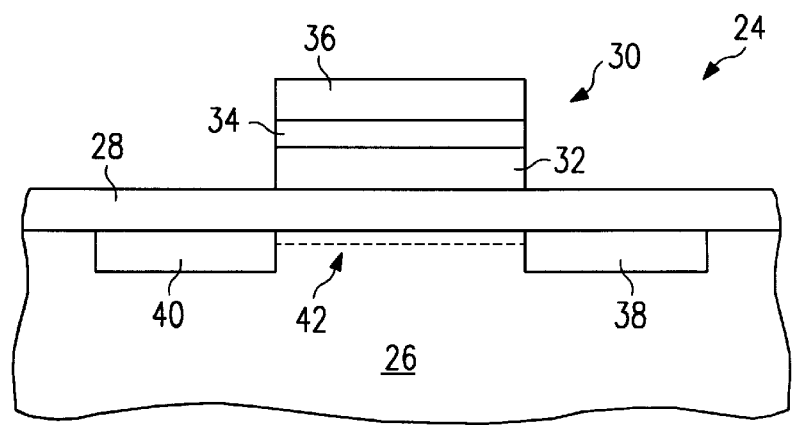
FIG. 2 illustrates a cross-sectional view of a field effect transistor having a floating gate that may be used in a memory array created using the present invention.

FIG. 2 is a cross-sectional illustration of a floating gate field effect transistor which may be used in a memory cell or memory cell array constructed in accordance with the teachings of the invention. FIG. 2 illustrates a transistor 24 which is formed on a semiconductor substrate 26. A gate oxide layer 28 is formed on an outer surface of the substrate 26. Gate stack 30 is disposed outwardly from the gate oxide layer 28.

Gate stack 30 comprises a floating gate layer 32, insulating dielectric layer 34 and a control gate layer 36. Floating gate layer 32 and control gate layer 36 may comprise doped polysilicon. Insulating dielectric layer 34 may comprise oxide or may be formed by alternate layers of oxide and nitride. In this embodiment, insulating dielectric layer 34 comprises a composite layer of oxide and nitride.

Transistor 24 also includes a source region 38 and a drain region 40 which define between them a channel region 42 disposed inwardly from gate stack 30. The control gate 36 is a continuous line connecting adjacent memory cells in the context of the memory cell array discussed above in connection with FIG. 1. In other words, control gate 36 forms a portion of a word line of the array. In contrast, the floating gate 32 is not continuous with respect to adjacent cells but is a single discrete conductive body for each cell within the array.

Figure 3:
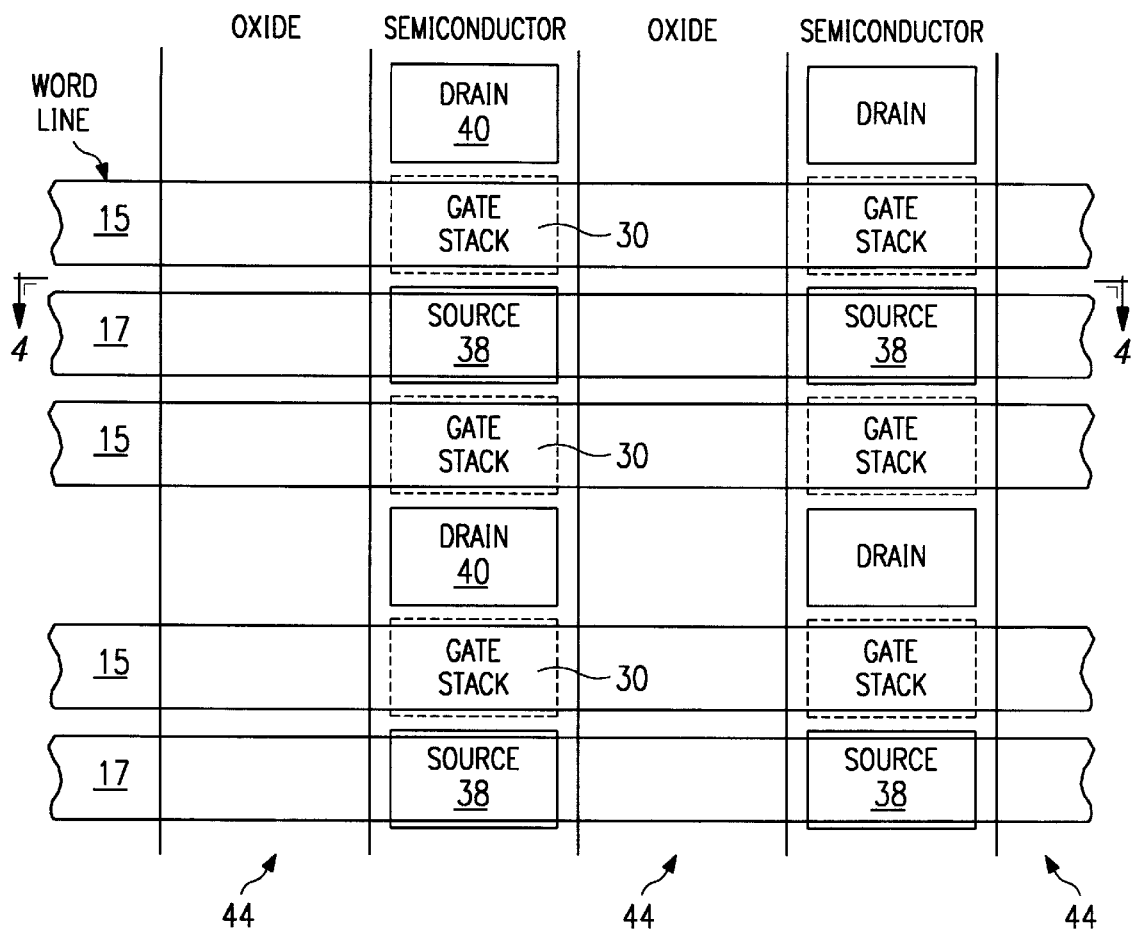
FIG. 3 is an enlarged plan view of a portion of a memory cell array which may be created in accordance with the invention.

FIG. 3 is an enlarged plan view of a portion of the memory array. FIG. 3 illustrates the connection of adjacent gate stacks 30 by word lines 15. FIG. 3 also illustrates the connection of adjacent source regions 38 by continuous source lines 17. Adjacent source regions 38 are electrically connected to one another by a source line 17, which is created by forming a conductive path through isolation region 44. In a memory structure formed in accordance with the teachings of the invention, the portion of isolation region 44 between adjacent source regions 38 comprises a trench. In order to create the conductive path between adjacent source regions 38, each trench is doped.

Figure 4:
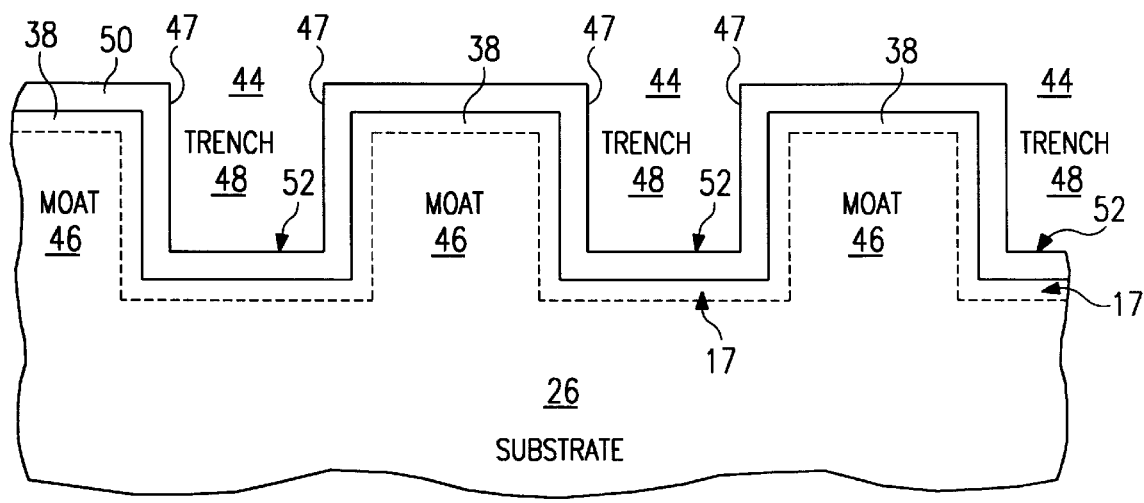
FIG. 4 is an enlarged cross-sectional view of a portion of the memory cell array of FIG. 3 illustrating the use of the present invention.

FIG. 4 illustrates a cross-sectional view of a portion of a memory array employing the present invention. The cross-section is taken from the point indicated in FIG. 3 but is shown at an intermediate point in the manufacturing process for creating the memory array illustrated in FIG. 3. In other words, the reference in FIG. 3 to FIG. 4 is merely to indicate a sample point at which the cross section of FIG. 4 is located but FIG. 4 is not an actual cross section of the array illustrated in FIG. 3.

The structure illustrated in FIG. 4 comprises a series of moats 46 and trenches 48. The outer portion of each moat 46 will serve as a source region 38 for two of the memory cells of a memory array constructed in accordance with the teachings of the invention. Each trench 48 appears in the isolation region 44 between adjacent memory cells. In the area of the isolation region 44 illustrated in FIG. 4, a conductive path will be created through each trench 48 connecting adjacent source regions 38 to form a continuous source line 17.

The invention employs a novel method to effectively dope the walls 47 of each trench 48 adjacent to the self-aligned source regions 38. To achieve such doping, a solid phase diffusion of an n-type dopant from a layer of silicate glass is used. In this embodiment, a solid phase diffusion of phosphorous from a layer of phosphosilicate glass 50 effectively dopes sidewalls 47. Additional ion implantation may also be used for the doping of source region 38 and for the trough region 52 of each trench 48.

Phosphosilicate glass can be made with a low amount of impurities using an atmospherical pressure chemical vapor deposition process and may contain a phosphorous concentration as high as $10^{21}$ cm$^3$. It has been demonstrated experimentally that the substrate sheet resistance can be lowered to below 20 ohms per square by annealing a 1000 Å deposited layer of phosphosilicate glass at 950° C. for fifteen minutes. The temperature and time of the anneal used to create the solid phase diffusion of phosphorous from the phosphosilicate glass layer 50 will depend upon the phosphorous concentration in the phosphosilicate glass layer 50 and the desired concentration in the sidewalls 47 of each trench 48.

Because the self-aligned source etch in the process flow of floating gate memory cells is conducted after cap oxide growth, no other parts of the wafer except the self-aligned source lines are doped by the solid phase diffusion anneal. Thermal oxide acts as a good diffusion barrier because phosphorous is a slow diffuser in thermal oxide. After the solid phase diffusion anneal, the phosphosilicate glass layer 50 can be easily etched off without etching away the protective cap oxide on other parts of the wafers by using a low-pressure, hydrofluoric acid vapor etch which has been demonstrated to have a selectivity of phosphosilicate glass over thermal oxide of more than 1000:1. Although this embodiment of the invention uses phosphorous for diffusion, other n-type dopants could be used instead of phosphorous.

The invention will at least augment the ion implantation steps, which also produce an n$^+$(As)/n$^-$(P) double-diffused source junction, in producing a continuous low resistance source line in memory cells that are formed using shallow trench isolation. If n$^+$ implantation is performed right after the source etch, then no extra mask step is required. If the phosphorous concentration in the phosphosilicate glass layer 50 is adjusted and properly controlled during the solid phase diffusion anneal, along with the n$^+$ ion implantation and anneal, then the n$^-$ ion implantation step may be skipped.

Example process steps that may be used to form a memory cell and/or memory structure in accordance with the invention will now be summarized. Other process steps could be used without departing from the scope of the invention. First, trenches 48 may be formed using a pattern etch. Oxide is then deposited in the trenches. Next, the tunnel oxide region is grown. Following tunnel oxide growth, a polysilicon layer is deposited that will be used to form floating gates 32. This polysilicon layer is then etched to form floating gates 32. Next, the oxide and nitride layer forming insulating dielectric layer 34 is deposited. A polysilicon layer is then deposited that will be used to form control gates 36. The control gate polysilicon layer, insulating dielectric layers, and floating gate polysilicon layer 32 are then pattern etched to form the gate stacks 30 and the word lines 15.

After formation of the gate stacks 30, a cap oxide layer is grown to isolate the gate stacks 30. After the cap oxide has been grown, the source lines are pattern etched. This step removes fill-oxide from the trench regions 48. The source regions 38 of each memory cell are then implanted with arsenic using ion implantation. After removal of the resist pattern, the silicate glass layer 50 containing an n-type dopant is deposited followed by a thermal anneal to dope the sidewalls of trenches 48. Note that the thermal anneal will also cause doping of the trough regions 52 of the trenches 48 as well as the surface of each moat 46. Following the thermal anneal, a selective etch is performed to remove the silicate glass layer 50. Finally, the drain regions 48 are implanted and the drain contacts are created.

Although the present invention has been described in detail, it should be understood that various changes, substitutions, and alterations can be made hereto without departing from the spirit and scope of the invention as defined by the appended claims.

What is claimed is:

1. A method for forming a continuous source line in a semiconductor device which comprises the steps of:

providing a semiconductor structure having alternate active device regions, each of said active device regions having a source region extending to a surface thereof, and trenches having a bottom and sidewalls separating each of said active device regions from each other;

depositing a continuous layer of a material containing a dopant over said active regions and said trenches contacting said source region of each of said active devices to provide an intermediate structure;

then heating the intermediate structure to cause migration of said dopant from said continuous layer of material into said source region of each of said active devices and into said sidewalls and bottom of said trenches in a continuous pattern to provide a continuous electrically conductive source line extending along all of said source regions and said trenches; and then completing fabrication of said semiconductor device.

2. The method of claim 1 wherein said layer of material containing a dopant is a silicate glass having an n-type dopant.

3. The method of claim 2, further comprising the step of:

removing the silicate glass layer by selectively etching the intermediate structure after heating.

4. The method of claim 2, wherein the n-type dopant comprises phosphorus.

5. The method of claim 2, further comprising the step of:

implanting the portion of each of the plurality of active device regions forming the source region of a transistor with arsenic ions.

6. The method of claim 5, wherein the n-type dopant comprises phosphorus.

7. A method for forming a continuous source line in a semiconductor memory device which comprises the steps of:

providing a semiconductor structure having alternate active device regions and trenches having a bottom and sidewalls separating each of said active device regions from each other with a portion of each of said active device regions containing a source region;

forming a first intermediate structure in each of said active regions by providing each of said active device regions with a floating gate and a control gate;

depositing a continuous layer of a material containing a dopant over said active regions and said trenches contacting said source region of each of said active devices to provide a second intermediate structure;

then heating the second intermediate structure to cause migration of said dopant from said continuous layer of material into said source region of each of said active devices and into said sidewalls and bottom of said trenches in a continuous pattern to provide a continuous electrically conductive source line extending along all of said source regions and said trenches; and then completing fabrication of said semiconductor device.

8. The method of claim 1 wherein said layer of material containing a dopant is a silicate glass having an n-type dopant.

9. The method of claim 8, further comprising the step of:
removing the silicate glass layer by selectively etching the second intermediate structure after heating.

10. The method of claim 8, wherein the n-type dopant comprises phosphorus.

11. The method of claim 8, further comprising the step of:
implanting the portion of each of the plurality of moats forming the source region of a floating gate memory cell with arsenic ions.

12. The method of claim 11, wherein the n-type dopant comprises phosphorus.

13. The method of claim 8, further comprising the step of:
pattern etching the first intermediate structure to expose the plurality of trenches prior to the depositing step.

14. The method of claim 13, further comprising the step of:
removing a resist pattern formed during the pattern etching step prior to the depositing step.

15. The method of claim 14, wherein the n-type dopant comprises phosphorus.

16. The method of claim 15, further comprising the step of:
removing the silicate glass layer by selectively etching the second intermediate structure after heating.

* * * * *

UNITED STATES PATENT AND TRADEMARK OFFICE
CERTIFICATE OF CORRECTION

PATENT NO. : 6,235,581 B1
DATED : May 22, 2001
INVENTOR(S) : Chen

It is certified that error appears in the above-identified patent and that said Letters Patent is hereby corrected as shown below:

Title page,
Under Related U.S. Application Data, the following needs to be added:
-- Provisional application No. 60/052,780, July 2, 1997 --

Column 1,
Before line 1 insert:
-- This application claims priority under 35 USC § 119(e)(1) of provisional application number 60/052,780, filed July 2, 1997. --

Signed and Sealed this

Fifth Day of March, 2002

*Attest:*

JAMES E. ROGAN
*Attesting Officer*  Director of the United States Patent and Trademark Office